(12) United States Patent
Izumome

(10) Patent No.: US 7,374,955 B2
(45) Date of Patent: May 20, 2008

(54) METHOD OF MANUFACTURING SILICON WAFER

(75) Inventor: Koji Izumome, Shibata (JP)

(73) Assignee: Covalent Materials Corporation, Tokyo (JP)

(*) Notice: Subject to any disclaimer, the term of this patent is extended or adjusted under 35 U.S.C. 154(b) by 82 days.

(21) Appl. No.: 11/518,514

(22) Filed: Sep. 11, 2006

(65) Prior Publication Data
US 2007/0059904 A1 Mar. 15, 2007

(30) Foreign Application Priority Data
Sep. 12, 2005 (JP) .................. 2005-263417

(51) Int. Cl.
*H01L 21/302* (2006.01)
(52) U.S. Cl. .................. 438/4; 438/795; 438/974; 117/3; 117/904; 257/E21.134
(58) Field of Classification Search .............. 438/4, 438/795, 974; 257/E21.134; 117/3, 904
See application file for complete search history.

(56) References Cited

U.S. PATENT DOCUMENTS

| | | | |
|---|---|---|---|
| 4,249,960 A * | 2/1981 | Schnable et al. ........ 219/121.6 |
| 4,292,093 A * | 9/1981 | Ownby et al. ............... 134/1.3 |
| 4,390,392 A * | 6/1983 | Robinson et al. ........... 438/473 |
| 4,436,557 A * | 3/1984 | Wood et al. .................. 438/89 |
| 4,575,466 A * | 3/1986 | Iwai et al. ................... 438/473 |
| 4,940,505 A * | 7/1990 | Schachameyer et al. ...... 117/97 |
| 5,367,980 A * | 11/1994 | Itom et al. ..................... 117/86 |
| 5,622,567 A * | 4/1997 | Kojima et al. .............. 118/726 |
| 6,531,416 B1* | 3/2003 | Kobayashi et al. ......... 438/795 |
| 2002/0070198 A1* | 6/2002 | Brusasco et al. ............. 216/24 |
| 2007/0059904 A1* | 3/2007 | Izumome .................... 438/487 |

FOREIGN PATENT DOCUMENTS

| JP | 7-161707 A | 6/1995 |
|---|---|---|
| JP | 11-135514 A | 5/1999 |
| JP | 2005-123241 A | 5/2005 |

* cited by examiner

*Primary Examiner*—George Fourson
(74) *Attorney, Agent, or Firm*—Foley & Lardner LLP

(57) ABSTRACT

The present invention provides a method of manufacturing a silicon wafer where a defect does not exist at a wafer surface layer part on which a device is formed, without affecting productivity and production costs of the wafer.

An ingot of a silicon single crystal is grown by way of Czochralski single crystal pulling method, this silicon single crystal ingot is sliced to produce a wafer, then a surface layer of the wafer is annealed for between 0.01 microseconds and 10 seconds (inclusive) by means of a laser spike annealing apparatus such that a temperature of a wafer surface layer part is between 1250° C. and 1400° C. (inclusive).

6 Claims, 2 Drawing Sheets

METHOD OF MANUFACTURING SILICON WAFER

CROSS-REFERENCE TO RELATED PATENT APPLICATIONS

The right of foreign priority is claimed under 35 U.S.C. § 119(a) based on Japan Application No. 2005-263417, filed Sep. 12, 2005, the entire contents of which, including the specification, drawings, claims and abstract, are incorporated herein by reference.

BACKGROUND OF THE INVENTION

1. Field of the Invention

The present invention relates to a method of manufacturing a silicon wafer and a silicon wafer, in particular to a method of manufacturing a silicon wafer using a laser spike anneal process.

2. Description of the Related Art

It is important for a surface layer part of a silicon wafer for manufacturing a device to have substantially no defects in order to improve electrical characteristics of the wafer, especially an oxide film withstand voltage characteristic.

Usually, in most cases, a void type defect (also referred to as a grown-in defect) referred to as COP (Crystal Originated Particle) introduced at the time of crystal growth exists in the surface layer part of the silicon wafer manufactured by way of Czochralski method (the CZ method).

Such a void type defect existing in the surface layer part of the silicon wafer damages an oxide film withstand voltage characteristic and may be a reason for adversely affecting an electrical property of the semiconductor device formed at the wafer. For this reason, especially in recent years, there is a strong need for a wafer having a defectless surface layer in which there is no such a defect at the surface layer, thus using a Si/Si epitaxial growth wafer in which a silicon epitaxial growth film is provided on the wafer surface, a wafer manufactured by way of a reduced growth rate at the time of growing a single crystal, etc.

However, there is a problem in that such a wafer has poor productivity and is very costly.

Then, for example, patent document 1 (Japanese Patent No. 3346249), patent document 2 (Japanese Patent No. 3410828), and patent document 3 (Japanese Patent Publication (KOKAI) No. 2005-123241 propose that, in order to improve the oxide film withstand voltage characteristic of a silicon wafer and to raise productivity, a silicon wafer should be heat-treated in a hydrogen and argon gas atmosphere by way of a method called rapid heating and rapid quench thermal treatment (Rapid Thermal Annealing: RTA).

As already described, the silicon wafer grown by using the CZ method has the defects (grown-in defects) introduced into its surface and inside at the time of growing the crystal. This grown-in defect has an octahedral structure when it is inside the crystal. In the case where the grown-in defect is exposed to the surface after being formed into the wafer, it is observed as a concave pit of a pyramid form, and an oxide film having a thickness of several nm is formed on a wall of the concave pit.

The hydrogen atmosphere as disclosed in the above-mentioned patent documents 1-3 allows removal of the inner wall oxide film of the grown-in defect exposed to the wafer surface by way of RTA process for the silicon wafer.

In addition, when the wafer is heated to a high temperature in such an RTA process, inter-lattice silicon (Si) and point defects of cavities take place inside the wafer at a high concentration.

Then, rapid quench (cooling) of the wafer causes the point defects to be excessive and diffuse outwards to the wafer surface. At this time, as inter-lattice silicon diffuses externally which has a large diffusion coefficient in the crystal and quickly diffuses, the inter-lattice silicon is captured by the grown-in defect on the surface of the wafer. Thus the grown-in defects are filled. As a result, the grown-in defects which exist in the wafer surface can be reduced.

In such rapid heating and rapid quench thermal treatment process (RTA process), it is often the case that an apparatus is used in which a silicon wafer is laid within a bell jar type container made of quartz, silicon carbide (for example), and a lamp heating system by means of a halogen lamp etc. is employed as a source of heating.

Therefore, since the process is carried out by using such an apparatus, the processing conditions are usually such that a rise-and-fall speed in temperature is 150° C./sec or less, a heat treatment temperature is 1200° C.-1350° C., and a period of time is 10 seconds or more.

However, when the rise speed in temperature is equal to or less than 150° C./sec within the above-mentioned range of the heat treatment temperature, the inter-lattice Si out of the inter-lattice silicon (Si) and the cavity generated due to the rising temperature is emitted towards the wafer surface by diffusion., Thus, the grown-in defect on the above-mentioned surface of the wafer is removed, but the grown-in defect existing inside the wafer surface layer cannot be removed, which results in a disadvantage that the grown-in defect remains in a device activity layer of the wafer surface layer part.

SUMMARY OF THE INVENTION

The present invention is made in order to solve the above-mentioned technical problems and aims to provide a method of manufacturing a silicon wafer, in which defects at a wafer surface layer part where a device is formed are removed as many as possible, without affecting productivity and production costs of the wafer.

The present invention is made in order to attain the above-mentioned aim, and a method of manufacturing a silicon wafer in accordance with the present invention is characterized in that an ingot of a silicon single crystal is grown by way of Czochralski single crystal pulling method, the silicon single crystal ingot is sliced to produce a wafer, then a surface layer of the wafer is annealed for between 0.01 microseconds and 0.8 seconds (inclusive) by means of a laser spike annealing apparatus such that a temperature of a wafer surface layer part is between 1250° C. and 1400° C. (inclusive).

The method of manufacturing the silicon wafer in accordance with the present invention has a constitutional feature that the silicon wafer grown by the CZ method is subjected to a spike annealing process by means of the laser spike annealing (LSA) apparatus in order to considerably avoid defects at the wafer surface layer on which a device is formed.

According to the above-mentioned manufacture method in accordance with the present invention, heating and cooling can be carried out quickly as compared with the conventional RTA method, such as lamp heating etc. Since the annealing period is between 0.01 microseconds and 0.8 seconds (inclusive), a diffusion distance of the inter-lattice Si is about 5 μm (at 1400° C., for 1 second) at the maximum, so that the inter-lattice Si generated in the silicon wafer which is annealed at a temperature of between 1250° C. and 1400° C. (inclusive) at the wafer surface layer part cannot be diffused up to the wafer surface, passing through the device activity layer having a depth of 10 μm from the surface.

As a result, the inter-lattice Si can fill the grown-in defect which exists inside the wafer surface layer, and the grown-in defect inside the surface layer is removed.

Thus, it is possible to cause the surface layer part, on which the device is formed, in the silicon wafer to have substantially no defects.

In addition, the laser spike annealing apparatus is a so-called laser heater, in which the whole wafer is scanned by laser, so that the process is completed in several minutes for each wafer having a diameter of 300 mm, depending on a laser beam diameter. Therefore, its productivity is improved considerably as compared with the conventional method, RTA, having a lamp etc. as a source of heating.

Here, the above-mentioned process is carried out preferably in an atmosphere of a mixed gas including any one of or at least two of reducing gas, rare gas, and nitrogen gas, more preferably in a hydrogen gas atmosphere or a gas atmosphere of hydrogen gas mixed with argon gas.

Further, in the manufacture method of the silicon wafer in accordance with the present invention, an example of the above-mentioned single crystal ingot to be used may be one that is grown under growth conditions where a pulling speed is high and a void-like defect takes place. As a result, it is possible to considerably improve the productivity of wafer manufacture.

As described above, according to the present invention, the wafer surface layer part on which the device is formed has considerably few minute defects, such as LSTD (Laser scattering tomography defect), and it is possible to manufacture a silicon wafer sufficiently available for next generation and next generation LSI's and an individual semiconductor device, etc. with sufficient productivity at low cost.

DETAILED DESCRIPTION OF THE PREFERRED EMBODIMENTS

Hereafter, the present invention will be described in detail and in particular.

As already described, the method of manufacturing the silicon wafer in accordance with the present invention has the feature that the silicon wafer grown by the CZ method is subjected to the spike annealing process by means of the laser spike annealing (LSA) apparatus in order to cause the wafer surface layer part, on which the device is formed, to have no defects, and it is possible to perform considerably rapid rise-and-fall process in temperature as compared with an RTA apparatus having a conventional halogen lamp etc. as the source of heating. For example, the latest LSA apparatus allows a temperature rise to 1350° C. with irradiation for a time period of the order of microseconds to milliseconds.

An example of this laser spike annealing (LSA) apparatus to be used may be one that is, marketed as a spike annealing apparatus for a silicon wafer substrate for forming a source/drain area, and an extension area of a semiconductor device, for example, and that has a beam diameter of about 1-50 mm.

Figure 1:
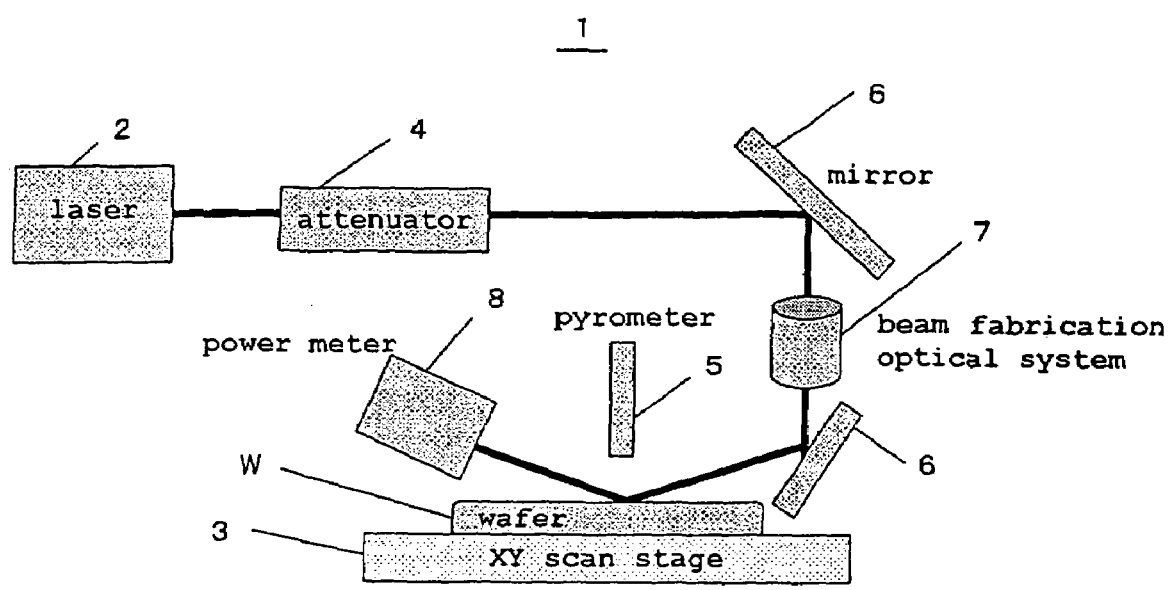
FIG. 1 is a block diagram showing an optical system of LSA.

An outline structure of this laser spike annealing (LSA) apparatus 1 is such that, as shown in FIG. 1, a continuous oscillation type laser 2 is used for a light source, and the whole wafer W surface is not heated but XY scan is carried out by means of an XY scan stage 3 to heat the wafer W locally. A pyrometer 5 monitors a peak temperature by laser output which is controlled by an attenuator 4, and a heating period of time is determined according to a scanning speed of the wafer. However, the laser heating is carried out in the atmosphere of reducing gas, rare gas, or nitrogen gas. In addition, reference numeral 6 in FIG. 1 indicates a mirror, reference numeral 7 shows a beam shaping optics, and reference numeral 8 indicates a power meter.

A laser wavelength and output of the LSA apparatus used for the present invention are suitably determined depending on a thickness of the device activity layer which should remove the grown-in defect. When the thickness of the activity layer to be formed is about 0.1-10 μm, non melt laser spike annealing is usually adopted which provides average output of 0.1 W-50 kW by means of oscillation media, such as continuous oscillation excimer laser: KrF (wavelength of 248 nm), Nd:YAG laser (1064 nm), carbon dioxide gas laser (wavelength of 10 μm), etc.

In the method of the present invention, a laser beam irradiation period of time is usually between 0.01 microseconds and 10 seconds, more preferably between 0.1 microseconds and 0.8 milliseconds.

If the irradiation period of time is shorter than 0.01 microseconds, annealing of the wafer surface layer is not sufficient. If it is longer than 0.8 seconds, the feature of LSA annealing that the rise-and-fall of the temperature is steep is not achieved. Neither can attain the desired purpose sufficiently.

As for the above-mentioned processing, the processing time for each wafer to finish is usually 1-10 minutes in the case of a wafer having a diameter of 300 mm.

Further, the wafer irradiation temperature near the surface at this time is preferably between 1250° C. and 1400° C. (inclusive), more preferably between 1300° C.-1350° C. (inclusive).

Using such a laser spike annealing (LSA) apparatus, inter-lattice Si generated in the silicon wafer which is annealed at a temperature of between 1250° C. and 1400° C. (inclusive) cannot be diffused up to the wafer surface, passing through the device activity layer having a depth of 10 μm from the surface. Because the annealing period of time is between 0.01 microseconds and 0.8 seconds (inclusive), and the longest diffusion distance is about 5 μm (diffusion coefficient $D=2\times10^{-7}$ cm$^2$/sec of inter-lattice Si at a temperature of 1400° C.) at a temperature of 1400° C. for one second period.

Therefore, the inter-lattice Si can fill the grown-in defect part at the wafer surface layer, so that the grown-in defect inside the surface layer is removed. Thus, it is possible to cause the surface layer part for forming the device in the silicon wafer to have substantially no defects.

Further, depending on the laser spike annealing (LSA) apparatus and the laser beam diameter, the process is completed in several minutes for each wafer having a diameter of 300 mm, because the whole wafer surface is scanned by laser.

Therefore, its productivity is improved considerably as compared with the conventional method, RTA, having an infra-red lamp etc. as the source, of heating.

In addition, by way of this LSA processing, although the cavity generated in a laser penetration annealing area is smaller in size than the grown-in defect, it acts as a defective core which is a capture site for metal impurities. Thus, after annealing the wafer has a gettering site to be a silicon wafer which is of a high quality, and very excellent in cost.

Further, the method of manufacturing the silicon wafer in accordance with the present invention can be applied also in the case where the silicon wafer having no defects which does not include a grown-in defect like a cavity is annealed.

Furthermore, the LSA annealing of the silicon wafer is preferably carried out in the atmosphere of reducing gases, such as hydrogen ($H_2$), ammonia ($NH_3$), in the rare gas atmosphere, such as a helium (He), argon (Ar), neon (Ne), in the nitrogen gas atmosphere, or in a mixed gas atmosphere of any two or more of these gases, more preferably in the atmosphere of hydrogen gas or the atmosphere of mixed gases where hydrogen is mixed with argon gas at a mixing rate of 1:1-1:20 by volume.

Still further, it is preferable that the processing in these atmospheres is carried out under reduced pressure (about 10 Torr)—atmospheric pressure.

Any silicon wafer can be used for the silicon wafer to be processed in the method of the present invention, without particular limitations, if it is obtained by slicing a silicon single crystal ingot which is grown by way of the Czochralski single crystal pulling method.

Having an effective diameter of 300 mm, a usual silicon single crystal ingot reduces a frequency of generating defects, such as the void defect and dislocation, so that the pulling speed from a crucible in a furnace is controlled and a temperature gradient in a crystal in the pulling axis direction at a temperature between a melting point of silicon and 1400° C. is maintained to exceed about 0.17 $mm^2$/K·min.

According to the present invention, it is possible to use, as a target, a silicon wafer which is pulled in a V-rich area (pulling speed: 0.5 or more mm/min, temperature gradient in crystal: 0.17 $mm^2$/K·min or more) that is a reluctant pulling condition area, and which generally has many void defects, such as COP etc., especially when pulling the single crystal by way of Czochralski method, whereby the productivity of-ingot pulling can be raised remarkably.

EXAMPLES

Hereafter, the present invention will be described with reference to an example, however the present invention is not limited at all by the description of the example.

Example 1

As a silicon (Si) wafer, one that was a substrate obtained by Czochralski method (CZ), of P-type (boron doped), having a diameter of 300 mm, a direction (100), electric resistivity of 1-10 Ωcm, and an initial oxygen concentration of $10 \times 10^{17}$ atoms/$cm^3$ was prepared.

Then, this substrate was subjected to LSA processing (temperature: 1300° C., period of time: 0.01 microseconds-50 milliseconds).

In addition, a diameter of an irradiation beam was 1 mm, and the entire surface of the wafer having a diameter of 300 mm was subjected to the LSA processing for about 5 minutes. The result is shown in FIG. 1. In addition, a relationship between an LSA period (microsecond) and LSTD (Laser scattering tomography defect) (/$cm^2$) is shown in FIG. 2.

Figure 2:
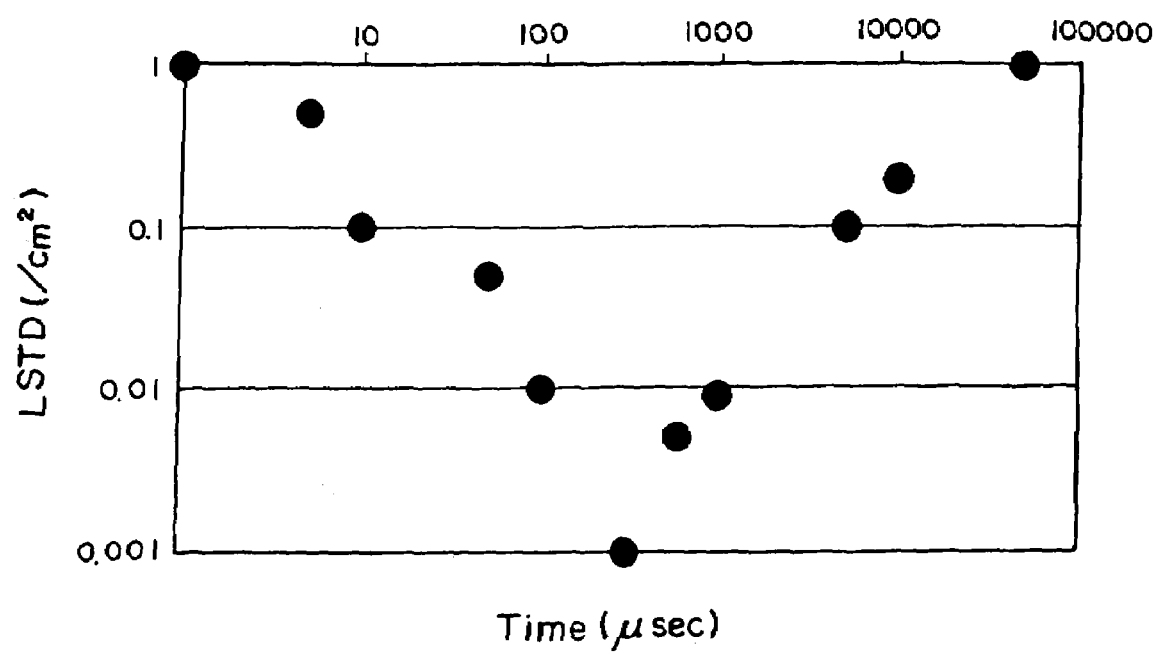
FIG. 2 is a graph showing a relationship between an annealing period of time for LSA, and LSTD.

As shown in FIG. 2, according to the present invention, LSTD may be 0.1/$cm^2$ or less by way of LSA processing where laser irradiation period is 10 microseconds-0.8 milliseconds.

As described above, the manufacture method of the silicon wafer in accordance with the present invention can be widely used for the manufacture of a silicon wafer.

What is claimed is:

1. A method of manufacturing a silicon wafer, wherein an ingot of a silicon single crystal is grown by way of Czochralski single crystal pulling method, said silicon single crystal ingot is sliced to produce a wafer, then a surface layer of said wafer is annealed for between 0.01 microseconds and 0.8 seconds (inclusive) by means of a laser spike annealing apparatus such that a temperature of a wafer surface layer part is between 1250° C. and 1400° C. (inclusive).

2. The method of manufacturing the silicon wafer as claimed in claim 1, wherein said laser spike annealing process is carried out in an atmosphere of a mixed gas including any one of or at least two of reducing gas, rare gas, and nitrogen gas.

3. The method of manufacturing the silicon wafer as claimed in claim 2, wherein said atmosphere gas is hydrogen gas or a mixed gas of hydrogen gas and argon gas.

4. The method of manufacturing the silicon wafer as claimed in claim 1, wherein growth of said ingot by way of said Czochralski single crystal pulling method is carried out under growth conditions including a growth condition where a void-like defect takes place.

5. The method of manufacturing the silicon wafer as claimed in claim 2, wherein growth of said ingot by way of said Czochralski single crystal pulling method is carried out under growth conditions including a growth condition where a void-like defect takes place.

6. The method of manufacturing the silicon wafer as claimed in claim 3, wherein growth of said ingot by way of said Czochralski single crystal pulling method is carried out under growth conditions including a growth condition where a void-like defect takes place.

* * * * *

UNITED STATES PATENT AND TRADEMARK OFFICE
CERTIFICATE OF CORRECTION

PATENT NO. : 7,374,955 B2  Page 1 of 1
APPLICATION NO. : 11/518514
DATED : May 20, 2008
INVENTOR(S) : Koji Izunome It is certified that error appears in the above-identified patent and that said Letters Patent is hereby corrected as shown below:

On the Title Page, Item (75) Inventor name should read as::

(75) Inventor: Koji Izu<u>n</u>omu

Signed and Sealed this

Twenty-third Day of September, 2008

JON W. DUDAS
*Director of the United States Patent and Trademark Office*

UNITED STATES PATENT AND TRADEMARK OFFICE
CERTIFICATE OF CORRECTION

PATENT NO.         : 7,374,955 B2  
APPLICATION NO. : 11/518514  
DATED                  : May 20, 2008  
INVENTOR(S)        : Koji Izunome It is certified that error appears in the above-identified patent and that said Letters Patent is hereby corrected as shown below:

On the Title Page, Item (75)

The inventor's name should read as:

(75)    Inventor:         Koji IZUNOME

Signed and Sealed this

Twenty-fifth Day of November, 2008

JON W. DUDAS  
*Director of the United States Patent and Trademark Office*